United States Patent [19]

Lou et al.

[11] 4,280,271
[45] Jul. 28, 1981

[54] THREE LEVEL INTERCONNECT PROCESS FOR MANUFACTURE OF INTEGRATED CIRCUIT DEVICES

[75] Inventors: Perry W. Lou, Houston; James E. Ponder, Cat Spring; Graham S. Tubbs, Houston, all of Tex.

[73] Assignee: Texas Instruments Incorporated, Dallas, Tex.

[21] Appl. No.: 83,702

[22] Filed: Oct. 11, 1979

[51] Int. Cl.$^3$ ............... H01L 21/265; H01L 21/225
[52] U.S. Cl. ........................................ 29/571; 29/578; 148/1.5; 148/174; 148/187; 148/188; 357/23; 357/41; 357/51; 357/59; 357/91
[58] Field of Search .............. 148/174, 187, 1.5, 188; 29/571, 578; 357/23, 41, 51, 59, 91

[56] References Cited

U.S. PATENT DOCUMENTS

| | | | |
|---|---|---|---|
| 3,590,471 | 7/1971 | Lepselter et al. | 29/571 |
| 3,650,019 | 3/1972 | Robinson | 29/571 |
| 3,679,492 | 7/1972 | Fang et al. | 29/571 X |
| 3,747,200 | 7/1973 | Rutledge | 29/571 |
| 3,865,650 | 2/1975 | Arita | 357/23 X |
| 3,921,282 | 11/1975 | Cunningham et al. | 29/571 |
| 4,013,489 | 3/1977 | Oldham | 148/188 X |
| 4,055,444 | 10/1977 | Rao | 148/187 X |
| 4,061,506 | 12/1977 | McElroy | 148/1.5 |
| 4,069,067 | 1/1978 | Ichinobe | 148/1.5 |
| 4,084,311 | 4/1978 | Yasuoka et al. | 29/571 |

Primary Examiner—L. Dewayne Rutledge
Assistant Examiner—W. G. Saba
Attorney, Agent, or Firm—John G. Graham

[57] ABSTRACT

An improved MOS device and method of making it are provided which utilize basically the standard N-chanel self-aligned silicon gate structure and process with implants for self-alignment, modified to allow three levels of interconnects. A P-type substrate is used as the starting material, with N+ source and drain regions defined prior to a polycrystalline silicon gate; thus the source and drain may run under polysilicon. Self-aligning implants after the polysilicon is defined produce the advantages of self-aligned gates.

4 Claims, 11 Drawing Figures

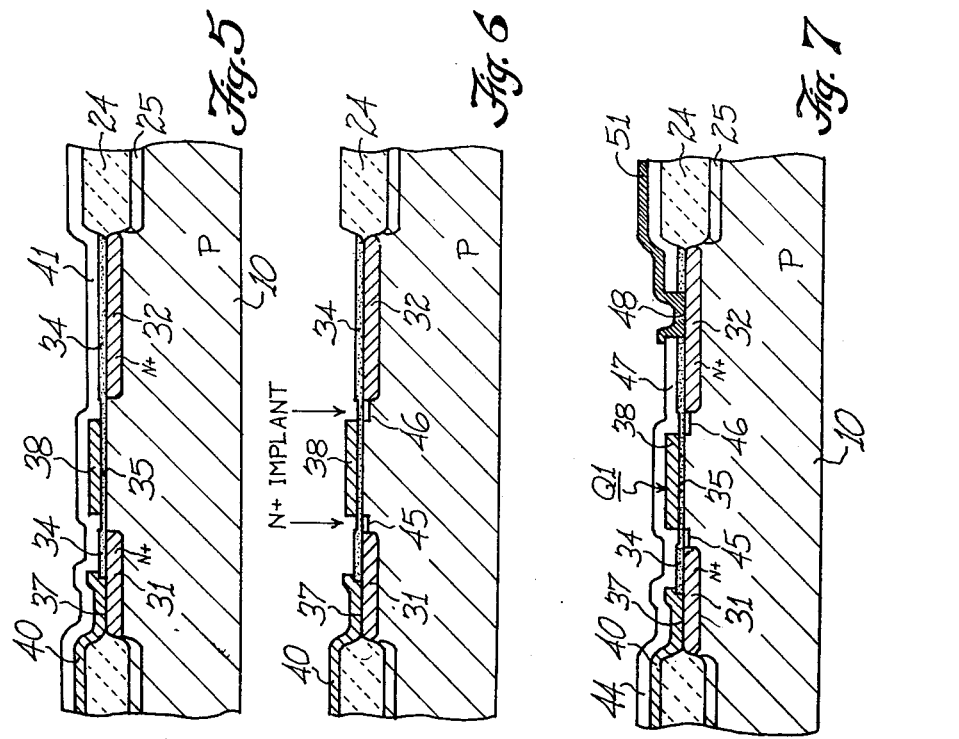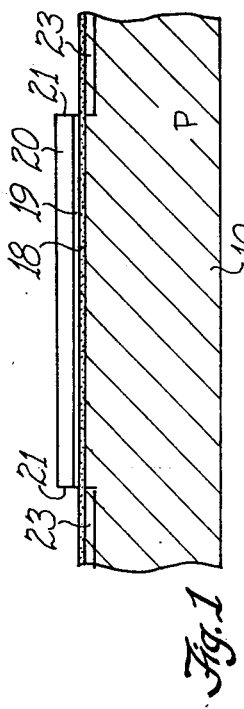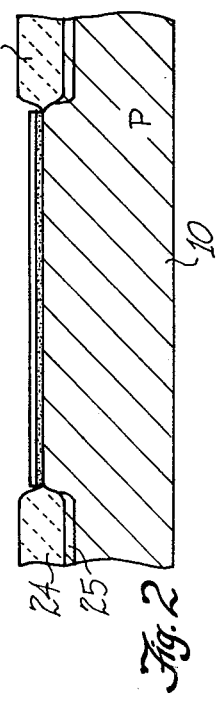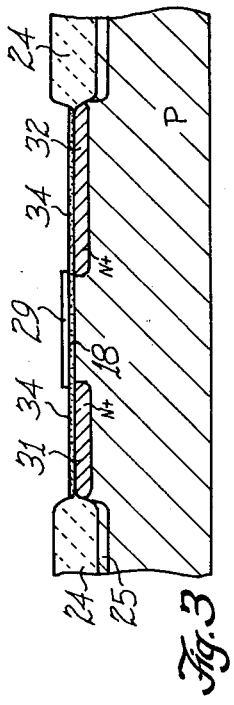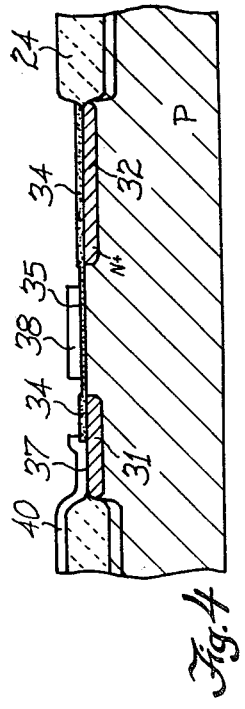

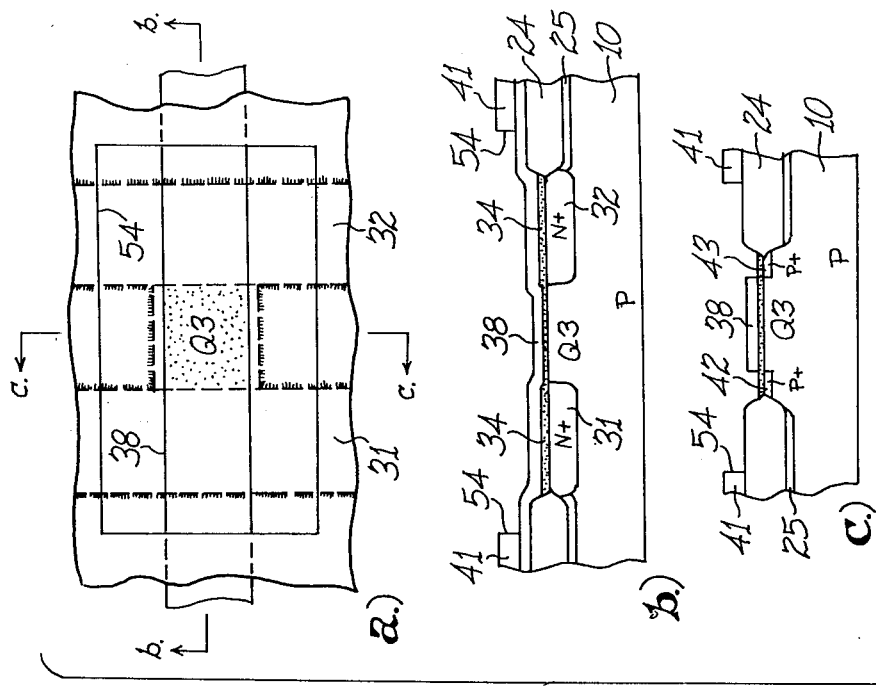
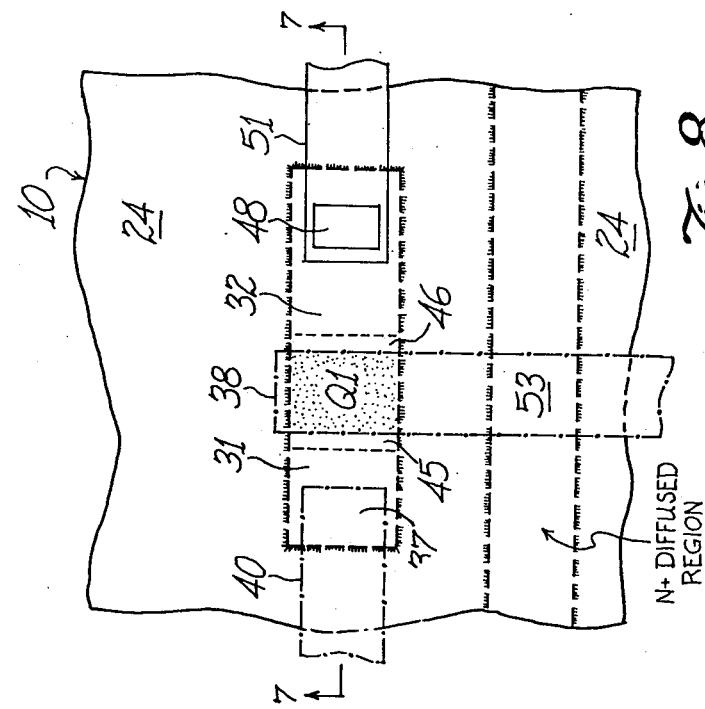

THREE LEVEL INTERCONNECT PROCESS FOR MANUFACTURE OF INTEGRATED CIRCUIT DEVICES

BACKGROUND OF THE INVENTION

This invention relates to integrated semiconductor devices and methods of manufacture, and more particularly to an improved method of making N-channel insulated gate field effect transistors in integrated circuit form.

Most MOS memory and processor type devices now being manufactured are N-channel of speed, circuit density and cost factors which heretofore have favored NMOS over P-channel. Established N-channel self-aligned gate processes are quite successful in large volume manufacture. However, one problem with the standard N-channel processes is that diffused N+ regions cannot be used as interconnects beneath polysilicon because whenever poly crosses moat a transistor is formed. This is because the poly and its underlying gate oxide provide the diffusion or implant mask for defining the N+ regions.

As an improvement in the NMOS process, it has been found that significant advantages result in a method which employs formation of N+ diffused regions prior to defining the poly gates, then self-aligning implants adjacent each gate in the source-drain areas as will be explained.

It is the principal object of this invention to provide improved NMOS circuit devices and an improved method of making such devices. Another object is to provide integrated circuit devices and methods of making devices which allow the speed advantage of N-channel transistors to be utilized, and which provide smaller size or higher circuit density with higher speed and/or lower cost. A further object is to provide NMOS devices which have self-aligned gates and yet allow polysilicon to cross over moat regions without forming transistors.

SUMMARY OF THE INVENTION

In accordance with an embodiment of the invention, an improved MOS device and method of making it are provided which utilize basically the standard N-channel self-aligned silicon gate structure and process with implants for self-alignment, modified to allow three levels of interconnects. A P-type substrate is used as the starting material, with N+ source and drain regions defined prior to a polycrystalline silicon gate; thus the source and drain may run under polysilicon. Self-aligning implants after the polysilicon is defined produce the advantages of self-aligned gates.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 1-7 are elevation views in section of a small part of a semiconductor chip at successive stages of manufacture of an N-channel transistor;

FIG. 8 is a plan view of the completed chip of FIG. 7; and

FIGS. 9a-9c are plan and section views of the semiconductor chip of FIGS. 1-8 showing another feature of the invention.

DETAILED DESCRIPTION OF SPECIFIC EMBODIMENT

A process for making NMOS devices according to the invention will be described with reference to FIGS. 1-10. The starting material is a slice of P-type silicon doped in growing to a resistivity of about 15 ohm-cm. The segment 10 of the slice seen in the FIGURES contains one transistor and is only a small part of what will be one bar, with the slice including perhaps two or three hundred bars. A processor device of the type used for a handheld calculator contains ten to twenty thousand transistors on a bar less than 150 mils on a side, so the transistors occupy less than about one mil in width. First, the slice is cleaned and a thin thermal oxide layer 18 is grown to about 1000Å. A layer 19 of silicon nitride is then deposited over the thermal oxide. A coating 20 of photoresist is deposited and exposed to light through a mask which defines the areas of thick field oxide, so upon developing holes 21 are left in the photoresist, and an etchant then removes the nitride layer 19 at the holes 21. Using the photoresist layer as a mask, a boron implant of about $5 \times 10^{12}$ per $cm^2$ at 100 KeV produces P+ regions 23 where channel stops are to be formed. To cure implant damages, a nitrogen anneal is performed as set forth in U.S. Pat. No. 4,055,444 issued to G. R. Mohan Rao, assigned to Texas Instruments.

As will be seen in FIG. 2, after removing photoresist a thermal oxidation step at 900° C. in steam for several hours produces a field oxide coating 24 in all areas not masked by the nitride. The oxide thickness is about 9000Å. Channel stop regions 25 are formed beneath the field oxide 24 by diffusion from the implanted P+ regions 23. Part of the implanted boron is consumed with the silicon upon oxidation, but part diffuses ahead of the oxidation front.

FIG. 3 illustrates the next steps in the process. A layer of silicon nitride is deposited then patterned to leave an area 29 of nitride over what is to be the N-channel transistor. A phosphorus deposition from $POCl_3$ and diffusion at 950° C. is used to produce N+ source and drain regions 31 and 32 with final resulting junction depth about 1.2 micron.

Then an oxidation step produces a barrier oxide layer 34 over the N+ regions to a thickness of about 2000X. The nitride layer 29 is then removed by etching.

Turning now to FIG. 4, the next step in the process, after removing the nitride coating 29 is an etch step used in the moat areas to remove the thin oxide for the gates of the N-channel transistors Q1. Oxide is removed without excess etch so that most of the oxide 34 will remain in place over the source and drain areas so that capacitive coupling and thin oxide problems are minimized in cross over areas. Next, the gate oxide layer 35 is grown over all exposed silicon surfaces by thermal oxidation to a thickness of 600 Å. This thickness is selected so that the threshold voltages for the N-channel transistors will be +0.8, taking into account other process parameters such as surface concentrations, QSS, metal work functions, and assuming a boron implant for Vt adjust is done at this point, with no masking required.

At locations 37 where polysilicon-to-silicon contact is to be made, the oxide 34 is removed using a photoresist operation. The next step in the process is deposition of a polycrystalline silicon layer over the entire top surface of the slice to form the gates of the transistors and certain interconnectons. A phosphorus deposition at this time functions to dope the polysilicon and render it high conductive (N-type). A coat of photoresist is then deposited over the polysiicon, and exposed to light through a mask which defines the gate 38 and interconnection 40, the developed. Etching removes the uncovered polysilicon. It is noted that the gate 38 is spaced from the source-drain regions 31, 32 at this point. The device would not function as a transistor because of these gaps between gate and source/drain regions.

FIG. 5 shows the device after a a photoresist layer 41 is applied and patterned to mask the P+ implant. This photoresist mask operation leaves photoresist everywhere except over the N-channel transistor areas of a certain type, not seen in FIG. 5. A boron implant of $3.5 \times 10^{13}$ dosage produces P+ regions for such transistors which will be explained. This implant provides the "exposed gate oxide" implant for N-channel transistors Q3 when the process is used to make arrays of memory cells or gates for example.

Turning now to FIG. 6, the photoresist coating 41 is removed and another photoresist coating 44 applied and patterned to cover the N-channel transistors Q3 (not shown in FIG. 6). The mask used for this purpose may be the complement of that used for the coating 41. A phosphorus or arsenic implant of $3.5 \times 10^{13}$ dosage produces the N-type regions 45 and 46 which self-align with the gate 38 and bridge the gap between the source and drain regions 31 and 32 and the gate.

The implants are activated by subjecting the slices to a temperature of about 950° C. in steam for about 10 minutes at this point. The thickness of the oxide over the implanted regions 45, 46 is increased from 600 Å to 1000 Å during this operation, serving to prevent phosphorus from outdiffusing from the multilevel oxide into the silicon during the next step.

Turning now to FIG. 7, the next step is deposition of an interlevel oxide layer 47 to a thickness of about 6000 Å. The layer 47 is then densified by heating at 1000° C. in a non-oxidizing atmosphere. The oxide layer 47 is patterned by a photoresist operation to open holes at contact areas 48 where metal-to-silicon contacts are to be made. A thin film of polysilicon is deposited using plasma deposition. An aluminum film is deposited over the entire surface of the slice then patterned to leave only the metal interconnections such as the strip 51. A protective overcoat (not shown) is added and patterned to expose bonding pads, then the slice scribed and broken into individual bars which are mounted in packages.

An important feature of the process described above is that the source and drain regions 31,32 are defined prior to the time the polysilicon gate 38 and interconnect 40, etc., are deposited and defined. Therefore, the source/drain regions (and elongated interconnects thereto in the silicon) or other moat areas may run under polysilicon strips without forming transistors. An example of that is at area 53 of FIG. 8. The designer is thus afforded three independent levels of interconnect: N+ source/drain, polycilicon, and aluminum. Prior silicon gate processes, with no source/drain interconnect capability, had essentially 1.5 levels of interconnect; aluminum plus doubly-doped polysilicon. The poly level counted as one-half since it was not fully independent of moat. The advantage of three levels is higher component density.

One of the problems in defining the source/drain regions prior to poly is alignment. The gate must have some finite source/drain overlap; this would require a design overlap of two microns so misalignment of masks (within production tolerances) cannot result in a no overlap situation. This two micron overlap, however, adversely affects speed because of the gate to source/drain capacitance. For this reason, the standard N-channel self-aligned gate process has been favored; the poly gate is defined first then used as a diffusion or implant mask in defining the source and drain regions. The standard self-aligned gate process precludes source/drain from running under poly, however, because whenever moat and poly lines cross a transistor is formed.

In the process described herein, the foregoing difficulties are circumvented by the self-aligning implant of FIG. 6. When the poly gate 38 is defined, see FIG. 5, the edges of the gate are spaced from the interior edges of the source/drain regions 31, 32 by an amount at least equal to the alignment tolerance. The N+ implant then self-aligns the gates with the source/drain regions by creating the region 45,46.

Important features of the invention are: aluminum can make contacts to the source/drain regions; polysilicon can make contacts the the source/drain regions; aluminum can run over poly lines; self-aligned transistors are fabricated; aluminum can make contacts to polysilicon; and source/drain regions can run under poly lines. At the same time, circuit density is high and the process is relatively simple and alignments non-critical.

A further important advantage of the process of this invention is the ability to take advantage of the "exposed gate oxide" implant technique of U.S. Pat. No. 4,061,506 granted to David J. McElroy, assigned to Texas Instruments. In a device such as a ROM or gate array as seen in FIGS. 9a–9c, source and drain lines 31,32 in an N-channel transistor Q3 run parallel to one another and perpendicular to a poly line 38; the channel length is no longer defined by the width of the poly but instead by the spacing between the source/drain lines 31,32. The gate moat is made wide enough to match or slightly exceed the width of the poly line 38, but by design or by misalignment within tolerance gate oxide is exposed in the areas on the sides of the poly line. These exposed gate oxide areas are implanted by an impurity opposite the source/drain type to prevent surface leakage and degradation with time due to the thin oxide. Thus, the P-type implant (FIG. 5) is used for the N-channel "exposed gate oxide" implant, producing P-type regions 42,43 seen in FIGS. 9a–9c. No additional masking steps are required; the photoresist 41 of FIG. 5 covers all N-channel transistors Q1 of the type seen in FIG. 5, but exposes all those of the Q3 type seen in FIGS. 9a–9c by an opening 54 in the photoresist, and in the same manner the photoresist 44 of FIG. 6 covers all N-channel transistors Q3 of the type in FIG. 9a–9c but exposes all N-channel transistors corresponding to the Q1 type seen in FIGS. 6–8.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making an insulated gate field effect transistor and a cross-over connection in an integrated circuit comprising the steps of:
   (a) selectively growing thick field oxide using an oxidation mask to provide an enclosed surface area on said face for the transistor and a defined area for the cross-over connection,
   (b) introducing N-type impurity into said defined area to produce a conductive region and into the enclosed surface area to produce source and drain regions of an N-channel transistor leaving a space between said source and drain regions to create a channel,
   (c) depositing a layer of conductive material on said face over a thin gate insulator and patterning the conductive material to provide a gate of an N-channel transistor in said enclosed surface area in the space between the source and drain regions but leaving a gap between such gate and source and drain regions, the conductive material after patterning also extending across said conductive region,
   (d) and implanting N-type impurity into the enclosed surface area, self-aligned with said gate, adjacent said source and drain regions, to bridge said gaps.

2. A method according to claim 1 wherein the step of patterning the layer of conductive material includes defining polycrystalline silicon interconnects which cross over N+ conductive regions.

3. A method of making an insulated gate field effect transistor and cross-over connections in an integrated circuit comprising the steps of:
   (a) introducing impurity of one type into a first surface area of a face of a semiconductor body of opposite type to produce source and drain regions of a transistor and also into a second surface area of the face to produce a conductive region,
   (b) depositing a layer of conductive material on said face over a thin gate insulator and patterning the conductive material to provide a gate of the transistor on said first surface area spaced from the source and drain regions by gaps, and also to provide a conductor crossing over said second surface area,
   (c) and implanting said one type impurity into said first surface area, self-aligned with said gates, adjacent said source and drain regions, to bridge said gaps.

4. A method according to claim 5 including the step of applying a second layer of conductive material over said face and patterning the second layer of conductive material to define interconnects.

* * * * *